United States Patent [19]

Salmonson et al.

[11] Patent Number: 5,726,857
[45] Date of Patent: Mar. 10, 1998

[54] APPARATUS AND METHOD FOR MOUNTING EDGE CONNECTORS WITHIN A CIRCUIT MODULE

[75] Inventors: Richard B. Salmonson; Stephen A. Bowen, both of Chippewa Falls, Wis.

[73] Assignee: Cray Research, Inc., Eagan, Minn.

[21] Appl. No.: 605,356

[22] Filed: Feb. 22, 1996

[51] Int. Cl.$^6$ ............................................. H05K 7/20
[52] U.S. Cl. ....................... 361/702; 439/485; 361/785
[58] Field of Search ............................... 165/80.3, 185; 174/16.3, 252; 439/485, 487, 59, 62, 64, 65, 68–70, 74, 157, 924, 928; 211/41; 361/784, 785, 790, 699, 702, 704, 707, 711, 717–721

[56] References Cited

U.S. PATENT DOCUMENTS

| | | | |
|---|---|---|---|
| 3,648,113 | 3/1972 | Rathjen | 361/707 |
| 4,470,100 | 9/1984 | Rebaudo et al. | 361/785 |
| 4,744,006 | 5/1988 | Duffield | 361/785 |
| 4,887,353 | 12/1989 | Preputnick | 361/785 |
| 5,339,221 | 8/1994 | Conroy-Wass | 361/784 |

FOREIGN PATENT DOCUMENTS 974900  1/1964  United Kingdom ............ 361/785

*Primary Examiner*—Gerald P. Tolin
*Attorney, Agent, or Firm*—Schwegman, Lundberg, Woessner & Kluth, P.A.

[57] ABSTRACT

An apparatus and method for mounting an edge connector assembly within a circuit module. Connector mounting rails are attached to the sides of a printed circuit board and the circuit board is then joined with a cold plate in order to form a circuit module. The mounting rail is an elongate strip of a substantially rigid material for attachment to the circuit board along one of its edges. The strip has an upper planar surface and inner and outer sides. The inner side is for attaching the strip to the edge of the circuit board. The outer side extends beyond the edge of the circuit board and is adapted to carry thereon a female block of the edge connector assembly. The strip also has a plurality of primary mounting openings formed in a predetermined pattern through the outer side of the strip for attaching the circuit board to a circuit module.

16 Claims, 4 Drawing Sheets

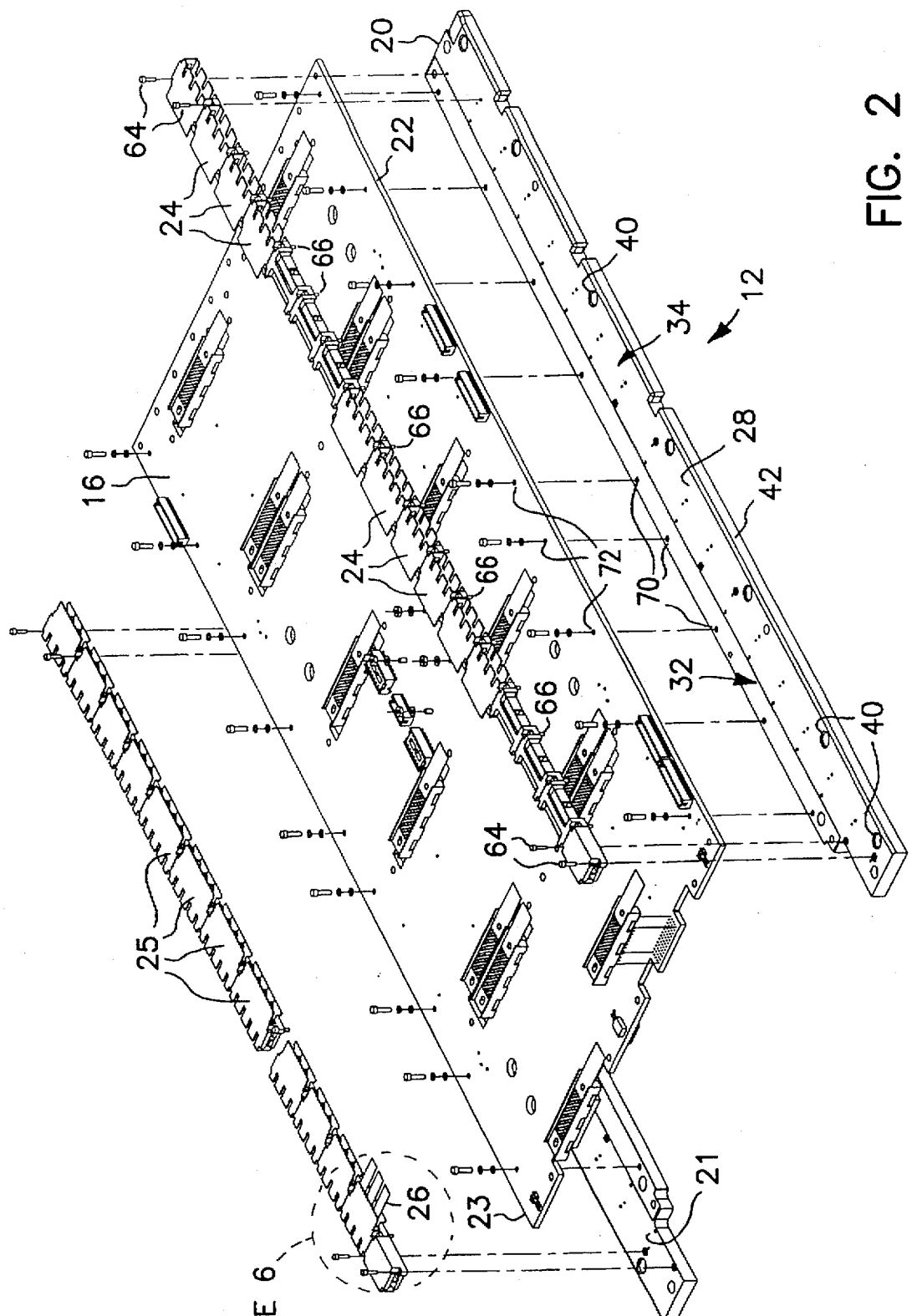

APPARATUS AND METHOD FOR MOUNTING EDGE CONNECTORS WITHIN A CIRCUIT MODULE

STATEMENT REGARDING GOVERNMENT RIGHTS

The present invention was made with government support under MDA 972-95-3-0032, awarded by ARPA. The Government has certain rights in this invention.

FIELD OF THE INVENTION

The present invention relates to computer circuit modules and more specifically to an apparatus and method for mounting edge connectors within a circuit module.

BACKGROUND OF THE INVENTION

High speed electronic digital computers of the type produced by Cray Research, Inc., the assignee hereof, generally utilize densely packaged or stacked banks of circuit modules. Each circuit module typically includes a heat sink or "cold plate" sandwiched between a pair of printed circuit boards carrying thereon a number of circuit, logic and memory devices including numerous integrated circuits. Each circuit module also typically includes a pair of edge connector assemblies disposed adjacent opposite edges of each circuit board for conductively connecting each board with other boards and modules of the computer. The edge connector assemblies generally have a plurality of slidable female connector blocks mounted to the cold plate adjacent the edges of the circuit boards with each electrical contact then conductively connected to the boards. A plurality of male connector pins are generally affixed to stationary blocks mounted to the computer side panels. The female connector blocks then engage the male connector pins when the circuit module is installed within the computer.

In prior computer designs of this type, such as the Cray Research, Inc. C-90 model, complete tear down of a module to repair or replace individual integrated circuits was not necessary because the integrated circuits were mounted on the exposed surfaces of each circuit board. In some more recent computer designs, the integrated circuits are attached to the bottom of each circuit board and sandwiched between the board and the cold plate. This is done to better dissipate heat generated by the electronic elements to the cold plate to improve the operation and durability of the computer. One type of integrated circuit further includes a cooling cap disposed on top of the circuit and abutting the cold plate. This type of integrated circuit and cooling cap assembly is disclosed in U.S. patent application Ser. No. 08/604,918 filed Feb. 22, 1996 and assigned to the assignee of the present invention.

Repair and replacement of individual integrated circuits is still necessary on such circuit modules. To access the integrated circuits, the boards must be removed from the cold plate. Disconnecting the edge connector assemblies and separating the female blocks from the cold plate, however, causes breakage or damage to the connectors and electrical connections. Hence, it is preferable that the female blocks no longer be mounted to the cold plate but instead remain attached to the circuit board assembly. The female blocks cannot, however, be mounted directly to the circuit boards because the high dimensional tolerance control and mechanical stability required for mounting and engaging the edge connectors cannot be readily achieved on the circuit board.

What is needed is an apparatus which permits use of existing edge connector assembly designs in the newer, more densely populated computer circuit module designs. What is also needed is an apparatus which permits disassembly of such a computer module for removal and replacement of individual integrated circuits without damaging to the edge connector assemblies. What is further needed is an apparatus which permits use of the existing board and edge connector designs in both of the above applications but which can also be used in computers having no cold plate assembled adjacent each board.

SUMMARY OF THE INVENTION

The present invention teaches an apparatus and method for mounting an edge connector assembly to a computer circuit module permitting disassembly of the module for repair and replacement of individual integrated circuits carried on the bottom of the board without damage to the edge connectors. In accordance with the present invention, a mounting rail is provided for adapting existing edge connector assembly designs for use with printed circuit boards used in several different applications.

The apparatus of the invention is a connector mounting rail of a substantially rigid elongate strip for attachment to an edge of a circuit board. The strip has an upper planar surface and an outer side extending beyond the edge of the board which is adapted to carry thereon a female connector block of an edge connector assembly. The strip also has an inner side for attachment to the edge of the circuit board. The inner side is attached to the bottom surface of the circuit board adjacent its edge so that a portion of the upper planar surface overlaps and abuts the bottom surface.

According to one aspect of the present invention, the mounting rail permits disassembly of a circuit board from a cold plate of a circuit module without removal and hence damage to the edge connectors by having the female connector block attached to the rail and not to the cold plate. The male connector pins may remain within the stationary block on the computer side panel when the module is removed from the computer and disassembled.

According to another aspect of the present invention, the mounting rail is adapted to carry an existing edge connector design obviating the need to redesign and retool a new connector assembly for the newer computer designs.

According to yet another aspect of the present invention, the mounting rail is further adapted for use with existing circuit board designs and with printed circuit boards to be installed in applications which include no cold plate. The existing edge connectors are now functional on these systems as well. The mounting rail may be attached to any other component of a circuit module which is adapted with mounting holes corresponding to the primary mounting holes of the mounting rail.

Objects, features and advantages of the present invention are to provide a connector mounting rail which adapts existing edge connectors for use with various circuit module constructions, permits disassembly of a circuit board from module without damage to the edge connectors for repair of individual integrated circuits, adapts existing edge connectors for use in a circuit module having no cold plate disposed adjacent each printed circuit board, and is rugged, durable, of relatively simple design and economical manufacture, and is relatively simple to install.

BRIEF DESCRIPTION OF THE DRAWINGS

FIG. 1 is a partially exploded top perspective view of a circuit module incorporating a printed circuit board including a connector mounting rail constructed in accordance with the present invention.

DESCRIPTION OF THE PREFERRED EMBODIMENT

Figure 2:
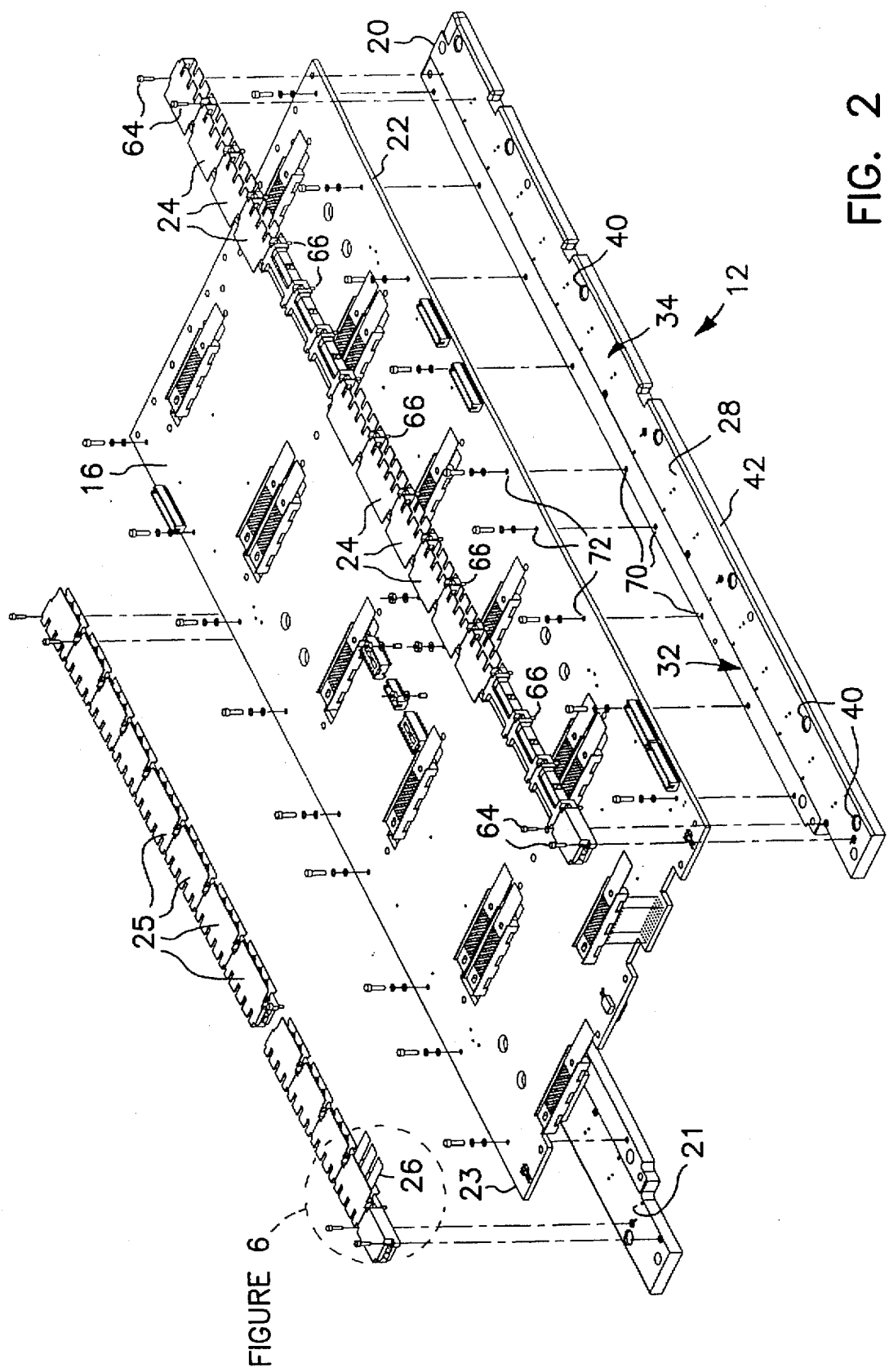
FIG. 2 is a partially exploded top perspective view of the printed circuit board shown in FIG. 1.

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Referring now to the drawings, FIG. 1 illustrates a computer circuit module 10 in a partially exploded view having a pair of printed circuit board assemblies 12, 13 constructed in accordance with the present invention mounted to a cold plate 14 of a typical construction. Printed circuit board assembly 12 includes a circuit board 16 carrying thereon a plurality of electronic devices and components (shown in FIG. 5) including integrated circuits 17 having direct cooling off the top and integrated circuit 18 mounted under a cooling cap 19. The devices, components and circuits are conductively connected in accordance with conventional printed circuit board assembly techniques. Cold plate 14 is intended to dissipate heat generated by the electronic devices and components during operation of the computer. Cold plate 14 herein is shown in very basic form to simplify description of the present invention. The cold plate may take on any number of configurations and constructions to facilitate attachment of the printed circuit boards without departing from the scope of the present invention.

Figure 6:
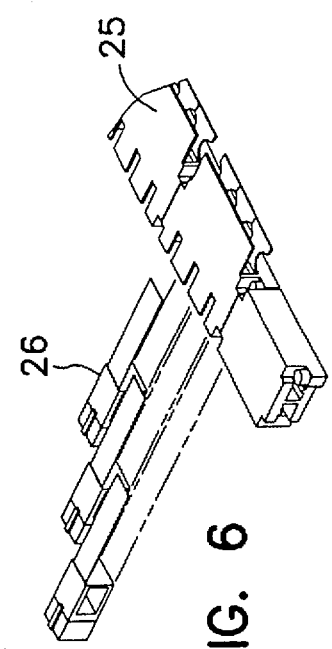
FIG. 6 is an exploded top perspective view taken from circle 6 in FIG. 2 of a partial edge connector assembly.

In one embodiment, a pair of connector mounting rails 20, 21 are attached to circuit board 16 on opposite edges 22, 23 thereof, respectively. A plurality of slidable female edge connector housings 24, 25 are mounted on the board assembly 12 for conductively connecting circuit board 16 to other printed circuit boards and components of the computer. Each of housings 24, 25 is carried on one of the mounting rails 20, 21, respectively, for receiving therein a series of female connectors 26 (best shown in FIG. 6) which are adapted to conductively receive therein a plurality of male connector pins (not shown) retained in stationary connector blocks carried on the computer side panels. In turn, one end of connector 26 is placed in conductive contact with circuit board 16, to transfer signals from the male connector pins to traces on circuit board 16.

FIG. 1 illustrates a typical construction of a computer circuit module. A pair of conventional power connectors 27 are disposed at one end of module 10, one for each printed circuit board, for mechanically and electrically connecting the module to a computer. It is common for a cold plate such as the one shown in FIG. 1 to be sandwiched between a pair of printed circuit boards to form a circuit module. For simplicity of illustration, FIG. 1 illustrates cold plate 14 and circuit board assembly 12 in exploded view. The second printed circuit board 13 having the same construction as board assembly 12 is shown assembled to the opposite side of cold plate 14 and will therefore not be further described herein. Mounting rails 20, 21 are intended to be adaptable to such a construction wherein each printed circuit board of the circuit module carries a pair of mounting rails thereon.

Figure 3:
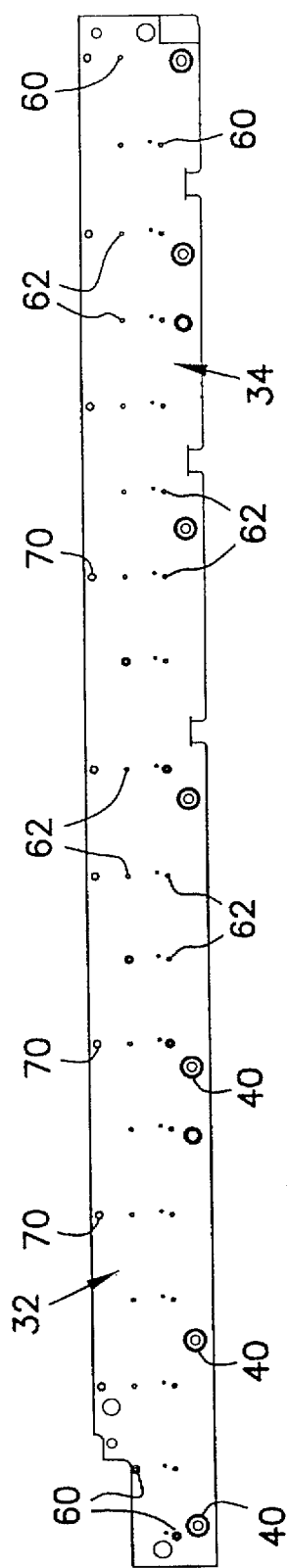
FIG. 3 is a plan view of the mounting rail shown in FIGS. 1 and 2.
Figure 4:
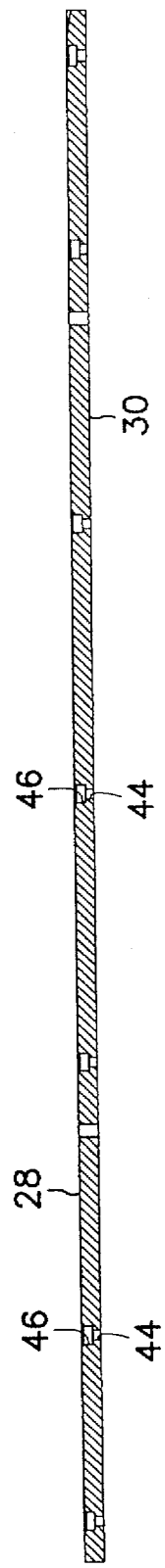
FIG. 4 is a side sectional view of the mounting rail taken along line 4—4 of FIG. 3.

Referring now to FIGS. 2, 3 and 4, a preferred embodiment of mounting rail 20 is illustrated. To simplify the description, it is intended that rail 21 be similar in construction to rail 20 except that it may be adapted for assembly to opposite edge 23 of board 16. Rail 20 is constructed from a substantially rigid material in the form of an elongate strip having a substantially planar upper surface 28 and a substantially planar lower surface 30 spaced apart from and parallel to the upper surface. The thickness of the strip material between the upper and lower surfaces 28 and 30 must be substantial enough to provide sufficient rigidity for accurate positioning of connector housings 24 and dimensional tolerance control for attaching rail 20 to board 16 and the connector assembly to the rail.

Rail 20 is preferably of a one-piece construction having an inner side 32 for mounting the rail to an edge 22 of printed circuit board 16. A portion of upper surface 28 and inner side 32 preferably overlap and abut bottom surface 33 of circuit board 16 adjacent edge 22 when attached thereto. Rail 20 also has an outer side 34 opposite the inner side 32 intended to extend beyond edge 22 of printed circuit board 16. The mounting rail material preferably has heat transfer characteristics such that heat generated by board assembly 12 and transferred to rails 20, 21 is dissipated quickly to cold plate 14 by the rails to avoid damage to the electrical components including integrated circuits 17 and 18 mounted on circuit board 16. The material of the preferred embodiment is 6061-T6 aluminum, although it is to be understood that numerous materials may be used without departing from the scope of the invention.

A plurality of primary mounting openings 40 are formed through rail 20 on outer side 34 adjacent its outer most edge 42. Primary openings 40 preferably include a bore 44 in lower surface 30 and a larger diameter concentric counter-bore 46 in upper surface 28 for receiving a fastener 48 therein when board assembly 12 is installed in a circuit module as shown in FIG. 1. The head 50 of fastener 48 is preferably recessed into counter-bore 46 flush with or below upper surface 28 of the rail 20. This is to minimize the amount of volume space taken up by the computer components because circuit modules are generally densely packed or stacked when installed into a computer.

A plurality of connector mounting openings 60 and alignment bores 62 may be formed on outer side 34 of rail 20. The openings 60 are preferably through-bores for receiving fasteners 64 therein for attaching connector housings 24 to rail 20. The bores 62 are preferably blind bores for receiving therein corresponding pins or projections 66 which extend downwardly from housings 24 for aligning the housing block relative to rail 20. Alternatively, any combination of blind bores and/or through-bores may be incorporated to accomplish the above identified purposes.

In the preferred embodiment, a plurality of rail openings 70 are formed through rail 20 on inner side 32 for attaching and aligning the rail to printed circuit board 16. A plurality of corresponding board openings 72 are formed through printed circuit board 16 adjacent edge 22. Board openings 72 are intended to concentrically align with rail openings 70 and receive therethrough a plurality of fasteners 74 having threads thereon for mechanically engaging corresponding threads formed in rail openings 70.

A typical prior art computer circuit module, such as that used in the C-90 model produced by Cray research, Inc., included a cold plate sandwiched between a pair of printed circuit boards having integrated circuits and other electrical components mounted thereon. The male connector pins and female connectors were mounted to the printed circuit board and the cold plate, respectively, such that once the circuit module was assembled, disassembly was difficult without breaking or damaging the edge connectors and electrical connections. The integrated circuits were mounted on the circuit board top surface, however, so disassembly of the module was not necessary to service individual integrated circuits.

Figure 5:
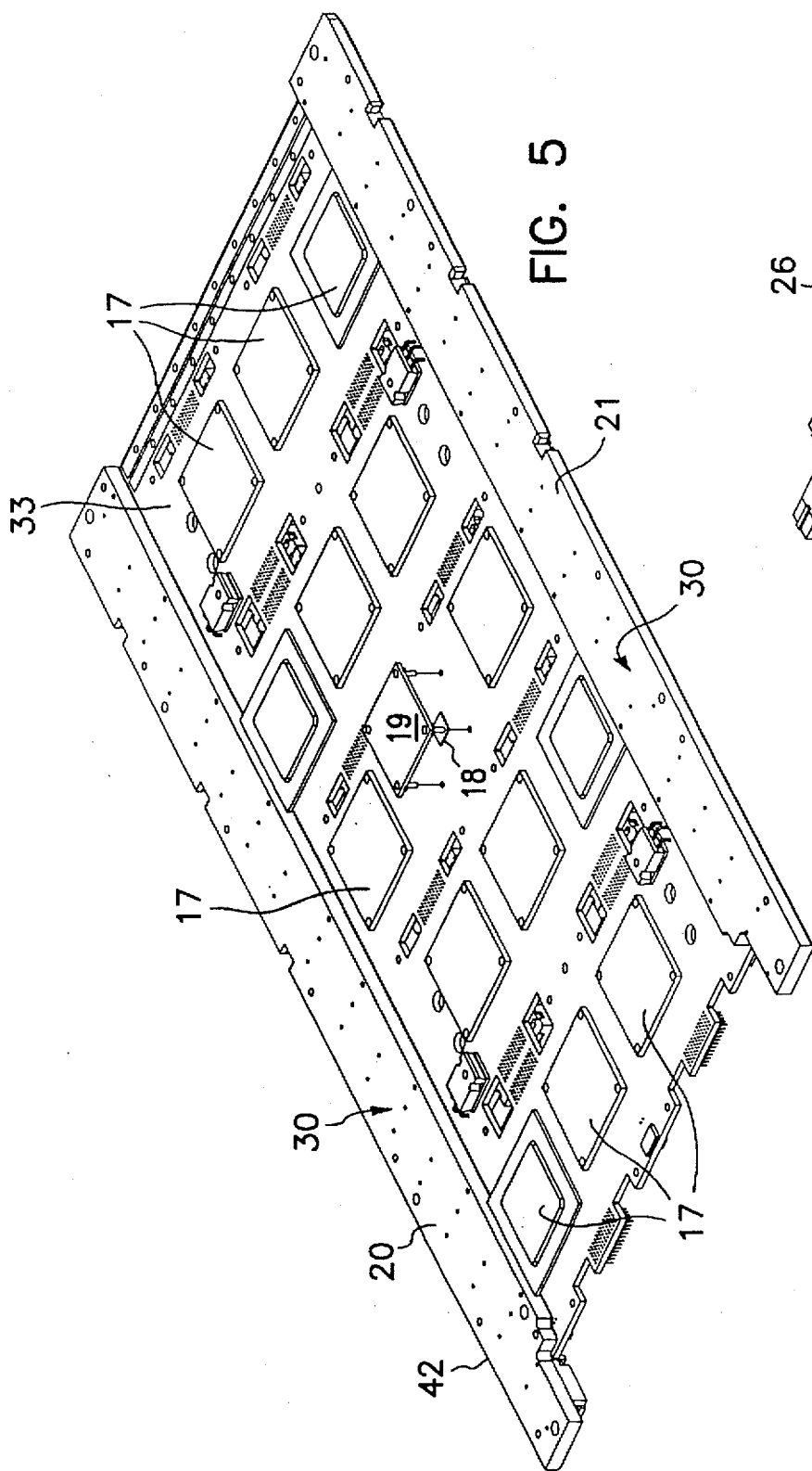
FIG. 5 is a bottom perspective view of the printed circuit board shown in FIG. 1.

The present invention permits disassembly of a circuit module to repair and replace individual integrated circuits 17 and 18 without having to separate connector housings 24, 25 and connectors 26 from board assembly 12 which in prior circuit modules would damage or destroy the connectors. According to the present invention, integrated circuits 17 are mounted to bottom surface 33 of board 16 so that they are sandwiched between cold plate 14 and the board. Integrated circuit 18 has a cooling cap 19 in direct contact with both integrated circuit 19 and cold plate 14. This configuration significantly improves heat transfer from the integrated circuit to the cold plate. It is desirable that the integrated circuits can be removed from the printed circuit board for repair or replacement. That is, the circuit modules must accommodate a complete tear down. One embodiment which accommodates such a complete tear down is illustrated in FIG. 5. Integrated circuits 17 and 18 are mounted to bottom surface 33 of printed circuit board 16 and thus sandwiched between the printed circuit board and the cold plate as illustrated in FIG. 1.

It is not feasible to simply mount connector housings 24, 25 to printed circuit board 16 because the high dimensional tolerance control necessary for connector attachment cannot be achieved by mounting on the board. By mounting housings 24, 25 to printed circuit board 16 and mounting rails 20, 21, the likelihood of breaking or damaging the edge connectors when removing board assembly 16 from cold plate 14 of circuit module 10 is reduced substantially. In addition, such a module design can also be used to permit installation of a printed circuit board including the mounting rails and edge connectors into circuit modules having no cold plate therein or into modules of the C-90 type. Hence, the mounting rails of the invention are intended to adapt a printed circuit board and edge connector assembly to several different circuit module configurations.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A computer circuit module comprising,
   a cold plate,
   a first printed circuit board disposed adjacent said cold plate and having a bottom surface facing said cold plate,
   a plurality of electronic elements carried on said bottom surface disposed between said cold plate and said bottom surface,
   a plurality of edge connector housings, and
   a first connector mounting rail attached to a first edge of said circuit board, wherein said first connector mounting rail comprises an elongate strip of a substantially rigid construction having an upper planar surface, said upper planar surface having an inner side attached to said bottom surface of said circuit board adjacent said edge and an outer side extending from beyond said first edge and carrying thereon said connector housings.

2. The circuit module of claim 1 wherein said first connector mounting rail further comprises a plurality of primary mounting openings formed through said strip on said outer side in a predetermined pattern for attachment of said first printed circuit board within said circuit module.

3. The circuit module of claim 1 wherein said first connector mounting rail further comprises a plurality of rail openings formed therethrough on said inner side in a predetermined pattern, said plurality of rail openings in concentric alignment with a plurality of corresponding board openings formed through said circuit board adjacent said edge to properly position said rail relative to said board.

4. The circuit module of claim 3 wherein each of said rail openings is threaded and receives therein and mechanically engages corresponding threads of a fastener passing through each of said board openings.

5. The circuit module of claim 1 wherein said elongate strip is constructed from 6061-T6 aluminum.

6. The circuit module of claim 1, the module further comprising a second connector mounting rail attached to a second edge of said circuit board, wherein the second edge is opposite said first edge and wherein said second edge includes a plurality of edge connector housings thereon.

7. The circuit module of claim 6, the module further comprising a second printed circuit board disposed adjacent said cold plate and having a bottom surface facing said cold plate, said second printed circuit board placed such that the bottom surfaces of said first and second printed circuit boards sandwich said cold plate therebetween.

8. A printed circuit board assembly for a computer circuit module, said printed circuit board assembly comprising,
   a printed circuit board having a bottom surface,
   a plurality of electronic elements carried on said bottom surface,
   a plurality of edge connector housings, and
   a first connector mounting rail attached to a first edge of said circuit board, wherein said first connector mounting rail comprises an elongate strip of a substantially rigid construction having an upper planar surface, said upper planar surface having an inner side attached to said bottom surface of said circuit board adjacent said edge and an outer side extending from beyond said first edge and carrying thereon said connector housings.

9. The printed circuit board assembly of claim 8 wherein said first connector mounting rail further comprises a plurality of primary mounting openings formed through said strip on said outer side in a predetermined pattern for attaching said board assembly within a circuit module.

10. The printed circuit board assembly of claim 8, the assembly further further comprising a second connector mounting rail attached to a second edge of said circuit board, wherein the second edge is opposite said first edge and wherein said second edge includes a plurality of edge connector housings thereon.

11. The printed circuit board assembly of claim 8 wherein said first connector mounting rail further comprises a plurality of rail openings formed therethrough on said inner side in a predetermined pattern, said plurality of rail openings in concentric alignment with a plurality of corresponding board openings formed through said circuit board adjacent said edge to properly position said rail relative to said board.

12. The printed circuit board assembly of claim 11 wherein each of said rail openings is threaded therein and mechanically engages corresponding threads of a fastener passing through each of said board openings.

13. The primed circuit board assembly of claim 8 wherein said elongate strip is constructed from 6061-T aluminum.

14. A method of mounting a plurality of edge connector housings to an edge of a printed circuit board having a bottom surface and a plurality of electronic elements carried thereon, the method comprising the steps of:

a. providing a first connector mounting rail in the form of an elongate strip of a substantially rigid construction having an upper planar surface, said upper planar surface having an inner side and an outer side, b. attaching said inner side of said mounting rail to said bottom surface of said circuit board such that a portion of said inner side overlaps and abuts said bottom surface adjacent said edge and said outer side extends from beyond said edge, and c. mounting said edge connector housings on said outer side of said mounting rail.

15. The method of claim 14 wherein the step of attaching includes the steps of:

forming a plurality of threaded rail openings through said inner side in a predetermined pattern, forming a plurality of corresponding board openings through said circuit board adjacent said edge, and passing a threaded fastener through said board openings and into said rail openings in order to mechanically engage said threaded rail openings and attach said mounting rail to said board.

16. The method of claim 14, the method further comprising the steps of:

providing a second connector mounting rail, wherein said second connector mounting rail is an elongate strip of a substantially rigid construction having an upper planar surface, said upper planar surface having an inner side and an outer side, attaching said second mounting rail to a second edge of said circuit board, wherein the second edge is opposite said first edge, wherein a portion of the inner side of said second mounting rail overlaps and abuts said bottom surface adjacent said second edge and wherein the outer side of said second mounting rail extends from beyond said second edge, and mounting a plurality of connector housings on the outer side of said second connector mounting rail.

\* \* \* \* \*

UNITED STATES PATENT AND TRADEMARK OFFICE
CERTIFICATE OF CORRECTION

PATENT NO. : 5,726,857
DATED : March 10, 1998
INVENTOR(S) : Richard B. Salmonson et al.

It is certified that error appears in the above-identified patent and that said Letters Patent is hereby corrected as shown below:

At Col. 7, line 9, please delete "primed" and insert --printed--.

Signed and Sealed this

Eighth Day of September, 1998

Attest:

BRUCE LEHMAN

*Attesting Officer*  *Commissioner of Patents and Trademarks*